United States Patent
Frey et al.

[11] Patent Number: 6,100,626
[45] Date of Patent: Aug. 8, 2000

[54] SYSTEM FOR CONNECTING A TRANSDUCER ARRAY TO A COAXIAL CABLE IN AN ULTRASOUND PROBE

[75] Inventors: Gregg W. Frey, East Wenatchee, Wash.; Jonathan E. Snyder, Whitefish Bay; Ajay A. Bhave, Brookfield, both of Wis.

[73] Assignee: General Electric Company, Milwaukee, Wis.

[21] Appl. No.: 08/344,053

[22] Filed: Nov. 23, 1994

[51] Int. Cl.[7] .................................................. H01L 41/08
[52] U.S. Cl. ............................................................ 310/334
[58] Field of Search .................................. 310/334–337, 310/322, 323, 328

[56] References Cited

U.S. PATENT DOCUMENTS

| | | | |
|---|---|---|---|
| 4,404,489 | 9/1983 | Larson, III et al. | 310/334 |
| 4,479,069 | 10/1984 | Miller | 310/334 |
| 4,686,408 | 8/1987 | Ishiyama | 310/334 |
| 4,701,659 | 10/1987 | Fujii | 310/334 |
| 4,773,140 | 9/1988 | McAusland | 310/334 X |
| 5,091,893 | 2/1992 | Smith et al. | 310/334 X |
| 5,115,810 | 5/1992 | Watanabe et al. | 310/334 X |
| 5,126,616 | 6/1992 | Gorton et al. | 310/334 |
| 5,275,167 | 1/1994 | Killam | 310/334 X |
| 5,295,487 | 3/1994 | Satoh et al. | 310/334 X |
| 5,296,777 | 3/1994 | Mine et al. | 310/334 |
| 5,329,496 | 7/1994 | Smith | 310/334 X |

OTHER PUBLICATIONS

Medical Electronics, Technical Bulletin, "High Density Terminations", 1 page.

Primary Examiner—Mark O. Budd
Attorney, Agent, or Firm—Dennis M. Flaherty; Christian G. Cabou; Phyllis Y. Price

[57] ABSTRACT

A system for connecting a transducer array to a coaxial cable. A fanout flex circuit is electrically connected to the coaxial cable, to form one subassembly, and a transducer flex circuit is incorporated into a transducer stack in electrical connection with the transducer array, to form another subassembly. The fanout flex circuit has a row of terminals of first linear pitch at one end and a row of terminals of second linear pitch, less than the first linear pitch, at the other end. The terminals of first linear pitch are electrically connected to the wires of the coaxial cable. The terminals of second linear pitch are electrically connected to a row of free terminals of the same linear pitch on the transducer flex circuit. A layer of pressure-activated conductive adhesive is applied on one row of terminals and then the other row of terminals is pressed against the adhesive-coated row. Then the adhesive is cured, thereby mass-connecting the signal electrodes of the transducer array to the wires of the coaxial cable in one step by simply adhering complementary ends of separate flex circuits.

13 Claims, 2 Drawing Sheets

SYSTEM FOR CONNECTING A TRANSDUCER ARRAY TO A COAXIAL CABLE IN AN ULTRASOUND PROBE

FIELD OF THE INVENTION

This invention generally relates to ultrasound probes having a linear array of piezoelectric transducer elements. In particular, the invention relates to systems for electrically connecting the transducer array of an ultrasound probe to a coaxial cable.

BACKGROUND OF THE INVENTION

A typical ultrasound probe consists of three basic parts: (1) a transducer package; (2) a multi-wire coaxial cable connecting the transducer to the rest of the ultrasound system; and (3) other miscellaneous mechanical hardware such as the probe housing, thermal/acoustic potting material and electrical shielding. The transducer package (sometimes referred to as a "pallet") is typically produced by stacking layers in sequence, as shown in FIG. 1.

First, a flexible printed circuit board 2 is bonded to a metal-coated rear face of a large piezoelectric ceramic block 4. A conductive foil 10 is bonded to a metal-coated front face of the piezoelectric ceramic block to provide a ground path for the ground electrodes of the final transducer array. Next, a first acoustic impedance matching layer 12 is bonded to the conductive foil 10. Optionally, a second acoustic impedance matching layer 14 having an acoustic impedance less than that of the first acoustic impedance matching layer 12 is bonded to the front face of the first matching layer 14.

The top portion of this stack is then "diced" by sawing vertical cuts, i.e., kerfs, from the rear face of the stack to a depth sufficient to divide the piezoelectric ceramic block into a multiplicity of separate side-by-side transducer elements. The kerfs produced by this dicing operation are depicted in FIG. 2. During dicing, the bus of the transducer flex circuit 2 (not shown in FIG. 2) is cut to form separate terminals and the metal-coated rear and front faces of the piezoelectric ceramic block are cut to form separate signal and ground electrodes respectively.

As shown in FIG. 1, the transducer stack also comprises a backing layer 8 made of suitable acoustical damping material having high acoustic losses, e.g., silver epoxy. This backing layer is coupled to the rear surface of the piezoelectric transducer elements to absorb ultrasonic waves that emerge from the back side of each element.

A known technique for electrically connecting the piezoelectric elements of a transducer array to a multi-wire coaxial cable is by a transducer flex circuit in which the conductive traces fan out, that is, a flex circuit having a plurality of etched conductive traces extending from a first terminal area to a second terminal area, the terminals in the first terminal area having a linear pitch greater than the linear pitch of the terminals in the second terminal area. The terminals in the first terminal areas are respectively connected to the individual wires of the coaxial cable. The terminals in the second terminal areas are respectively connected to the signal electrodes of the individual piezoelectric transducer elements.

Using this method, the resulting flex circuit can have signal runs which fan out so that the wires of a multi-wire coaxial cable, purchased from an outside vendor, can be attached directly. Since the circuit board is flexible, the wiring assembly can be folded to occupy a very small cross section. However, direct connection of the coaxial cable wires to the individual terminals of the flex circuit is a time-consuming and error-prone process. The primary difficulty is that each separate wire of the coaxial cable needs to be properly aligned and then bonded to a respective terminal of the flex circuit.

SUMMARY OF THE INVENTION

The present invention is a method and a system of connecting a transducer array to a coaxial cable which overcomes the aforementioned disadvantage of the prior art connection method. In accordance with the preferred embodiment of the invention, a fanout flex circuit is electrically connected to the coaxial cable, to form a first subassembly, and a transducer flex circuit is incorporated into a transducer stack in electrical connection with the transducer array, to form a second subassembly. These subassemblies can be separately tested before being joined into a final assembly.

In accordance with the present invention, the fanout flex circuit has a row of terminals of first linear pitch at one end and a row of terminals of second linear pitch, less than the first linear pitch, at the other end. The terminals of first linear pitch are electrically connected to the wires of the coaxial cable. The terminals of second linear pitch are electrically connected to a row of free terminals of the same linear pitch on the transducer flex circuit. This is accomplished by either soldering or using Z-axis conductive adhesive on one row of terminals and then pressing the other row of terminals against the adhesive-coated row. When the adhesive is cured, the signal electrodes of the transducer array will have been mass-connected to the wires of the coaxial cable in one step by simply adhering complementary ends of separate flex circuits.

DETAILED DESCRIPTION OF THE PREFERRED EMBODIMENT

Figure 3:
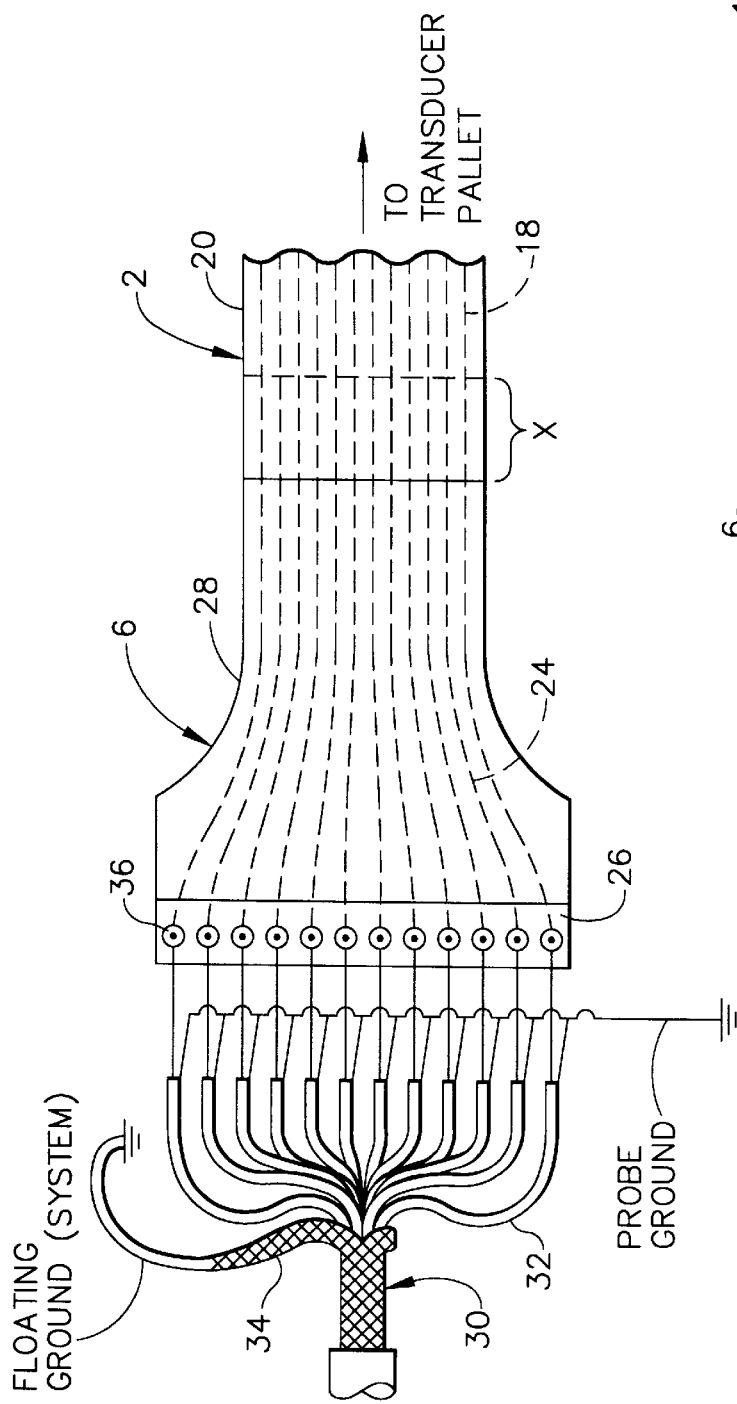
FIG. 3 is a plan view showing the connection of a fanout flex circuit to a transducer flex circuit and to a multi-wire coaxial cable in accordance with the preferred embodiment of the invention.

Referring to FIG. 3, an electrical connection system in accordance with the preferred embodiment of the present invention comprises a transducer flex circuit 2 and a fanout flexible circuit 6. The flex circuits are electrically connected in a region X of overlapping terminal areas. The other terminal area of transducer flex circuit 2 is electrically connected to the signal electrodes of the piezoelectric transducer array (not shown in FIG. 3). The other terminal area of fanout flex circuit 6 is electrically connected to the wires 32 of a multi-wire coaxial cable 30. Each wire 32 is a coaxial cable with a center conductor and an exterior ground braid. The ground braids are connected to a common probe ground. The coaxial cable 30 has a braided sheath 34 which is connected to the common ground of the ultrasound system (machine ground).

Figure 1:
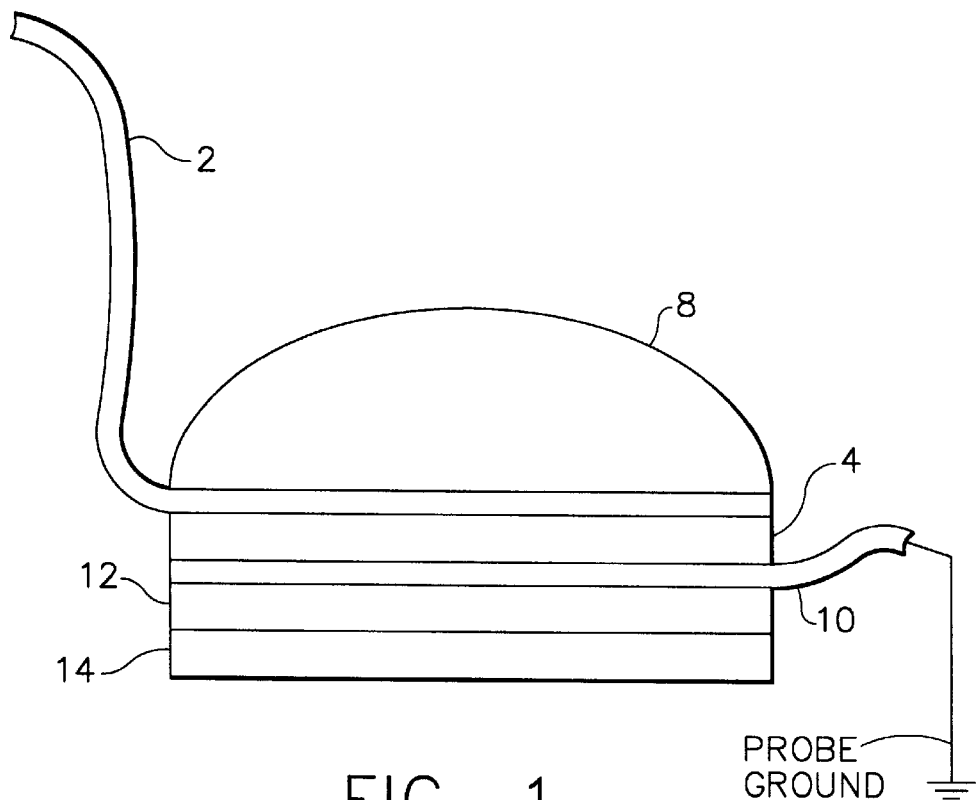
FIG. 1 is a an end view of a conventional transducer array having a flexible printed circuit board connected to the signal electrodes of the transducer elements.
Figure 2:
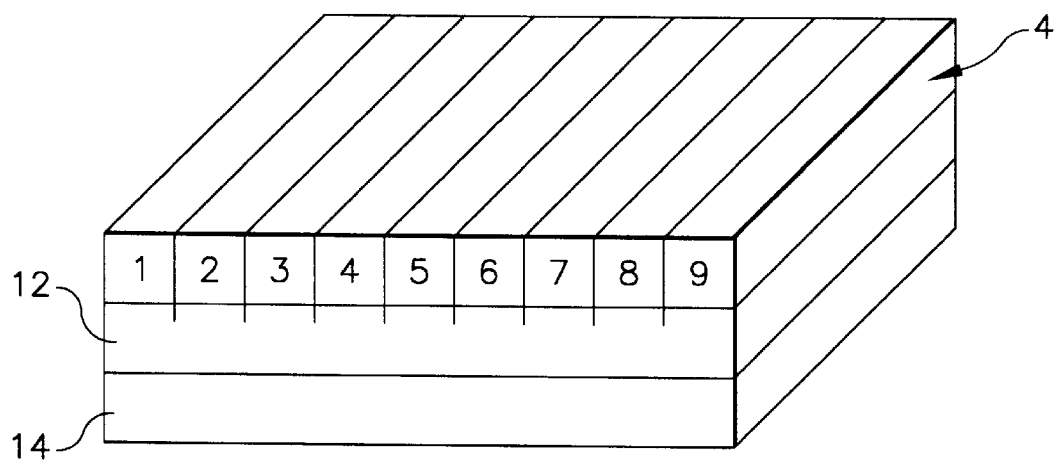
FIG. 2 is an isometric view of a typical transducer array after dicing.
Figure 4:
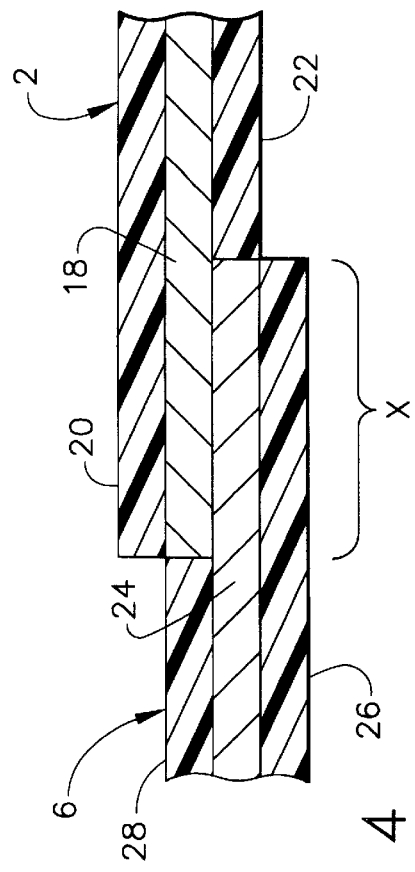
FIG. 4 is a detailed sectional view of the region of overlap of the flex circuits depicted in FIG. 3.

The transducer flex circuit 2 has a multiplicity of conductive traces 18 etched on a substrate 20 of electrically insulating material. A cover layer 22 of electrically insulating material is formed on top of the etched substrate, with the exception of the overlap region X (see FIG. 4). The number of conductive traces 18 on transducer flex circuit 2 is equal to the number of piezoelectric transducer elements. Each conductive trace 18 has a terminal at one end which is electrically connected in conventional manner to the signal electrode of a respective piezoelectric transducer element.

Similarly, the fanout flex circuit 6 has a multiplicity of conductive traces 24 etched on a substrate 26 of electrically insulating material. A cover layer 28 of electrically insulating material is formed on top of the etched substrate, with the exception of the overlap region X (see FIG. 4). The number of conductive traces 24 on fanout flex circuit 6 is equal to the number piezoelectric transducer elements, i.e., equal to the number of conductive traces 18 on transducer flex circuit 2. Each conductive trace 24 has a pad 36 at one end which is electrically connected to a respective wire 32 coming out of the multi-wire coaxial cable 30. The linear pitch of pads 36 is greater than the linear pitch of the terminals on the opposite end of the fanout flex circuit 6.

In accordance with the present invention, each conductive trace 18 on transducer flex circuit 2 has a terminal which overlaps and is electrically connected to a terminal of a corresponding conductive trace 24 on fanout flex circuit 6 in the overlap region X. The overlap of the terminals of conductive traces 18 and 24 is shown in detail in FIG. 4. The linear pitch of the terminals of conductive traces 18 is equal to the linear pitch of the terminals of conductive traces 24 in the overlap region. Therefore, the conductive traces 18 of transducer flex circuit 2 can be mass-connected to the conductive traces 24 of fanout flex circuit 6 by applying a layer of pressure-activated Z-axis conductive adhesive on the terminal area of one of the flex circuits and then pressing the terminal areas of the two flex circuits together or by soldering.

The pressure-activated Z-axis conductive adhesive consists of an epoxy doped with small spheres of conductive metal. The conductive spheres are dispersed in the nonconductive epoxy with a density such that the spheres do not contact. Thus, the adhesive in its unpressured state in nonconductive. When the opposing terminals are pressed together, however, the epoxy flows outward as the opposing terminals approach each other. At the point where the opposing terminals are separated by a distance equal to the diameter of the conductive spheres, the conductive spheres trapped between the opposing terminals will be in electrical contact with both terminals, thereby electrically connecting each pair of opposing terminals to each other. Holding the terminals in this position, the adhesive is cured.

Using the foregoing method, all pairs of opposing terminals can be mass-connected electrically in a single simple operation. This is very convenient for the probe manufacturer, who need not perform the time-consuming and error-prone process of individually connecting the wires of the coaxial cable to the corresponding terminals on the transducer flex circuit.

The foregoing preferred embodiment has been disclosed for the purpose of illustration. Variations and modifications which do not depart from the broad concept of the invention will be readily apparent to persons skilled in the design of ultrasonic probes. All such variations and modifications are intended to be encompassed by the claims set forth hereinafter.

What is claimed is:

1. A method for electrically connecting a multiplicity of electrodes on a transducer array to a corresponding multiplicity of wires of a coaxial cable, comprising the steps of:

electrically connecting one end of a first flexible circuit to said signal electrodes of said transducer array, said other end of said first flexible circuit having a first row of terminals spaced with a first linear pitch;

electrically connecting one end of a second flexible circuit to said wires of said coaxial cable, said other end of said second flexible circuit having a second row of terminals spaced with said first linear pitch;

applying a coating of Pressure-activated electrically conductive adhesive over one of said first and second rows of terminals;

overlapping said first and second rows of terminals with said coating of pressure-activated electrically conductive adhesive therebetween and with said first row of terminals aligned with said second row of terminals;

pressing said first and second rows of terminals together until an electrical connection is established therebetween; and holding said first and second rows of terminals in a pressed state while said adhesive is cured.

2. The method as defined in claim 1, wherein said signal electrodes of said transducer array are spaced with a second linear pitch and said one end of said first flexible circuit has a third row of terminals spaced with said second linear pitch.

3. The method as defined in claim 2, wherein said one end of said second flexible circuit has a fourth row of terminals spaced with a third linear pitch greater than said second linear pitch.

4. The method as defined in claim 1, wherein said pressure-activated conductive adhesive comprises nonconductive epoxy impregnated with spheres of conductive material.

5. A system for electrically connecting a multiplicity of electrodes on a transducer array to a corresponding multiplicity of wires of a coaxial cable, comprising:

a first flexible circuit having one end electrically connected to said signal electrodes of said transducer array; and a second flexible circuit having one end electrically connected to said wires of said coaxial cable, wherein the other end of said first flexible circuit overlaps and is electrically connected to the other end of said second flexible circuit, said other end of said first flexible circuit having a first row of terminals spaced with a first linear pitch and said other end of said second flexible circuit having a second row of terminals spaced with said first linear pitch, each terminal of said first row of terminals overlapping a respective terminal of said second row of terminals, said overlapping terminals being bonded by a layer of cured adhesive sandwiched therebetween, said layer of cured adhesive comprising electrically conductive means.

6. The system as defined in claim 5, wherein said signal electrodes of said transducer array are spaced with a second linear pitch and said one end of said first flexible circuit has a third row of terminals spaced with said second linear pitch.

7. The system as defined in claim 6, wherein said one end of said second flexible circuit has a fourth row of terminals spaced with a third linear pitch greater than said second linear pitch.

8. An ultrasound probe comprising:

a multiplicity of transducer elements made of piezoelectric ceramic, each of said transducer elements having a respective signal electrode and a respective ground electrode;

a coaxial cable having a multiplicity of wires;

a first flexible circuit having a first multiplicity of conductive paths, one end of each conductive path of said first multiplicity being electrically connected to a respective one of said signal electrodes of said transducer elements; and a second flexible circuit having a second multiplicity of conductive paths, one end of each conductive path of said second multiplicity being electrically connected to a respective one of said wires of said coaxial cable, wherein the other ends of said conductive paths of said first multiplicity are spaced at a first linear pitch and the other ends of said conductive paths of said second multiplicity are spaced at said first linear pitch, each other end of said conductive paths of said first multiplicity overlapping a respective other end of said conductive paths of said second multiplicity, said overlapping other ends of said conductive paths being bonded by a layer of cured adhesive sandwiched therebetween, said layer of cured adhesive comprising electrically conductive means.

9. The ultrasound probe as defined in claim 8, wherein said signal electrodes of said transducer elements are spaced with a second linear pitch and said one ends of said conductive paths of said first multiplicity are spaced with said second linear pitch.

10. The ultrasound probe as defined in claim 9, wherein said one ends of said conductive paths of said second multiplicity are spaced with a third linear pitch greater than said second linear pitch.

11. The ultrasound probe as defined in claim 10, wherein said one end of each of said conductive paths of said second multiplicity comprises a pad of electrically conductive material.

12. The ultrasound probe as defined in claim 8, wherein said cured adhesive comprises nonconductive epoxy and said electrically conductive means comprise particles of conductive material impregnated in said nonconductive epoxy.

13. The system as defined in claim 5, wherein said cured adhesive comprises nonconductive epoxy and said electrically conductive means comprise particles of conductive material impregnated in said nonconductive epoxy.

* * * * *